(12) United States Patent
Robbins et al.

(10) Patent No.: US 6,992,375 B2
(45) Date of Patent: Jan. 31, 2006

(54) ANCHOR FOR DEVICE PACKAGE

(75) Inventors: Roger A. Robbins, McKinney, TX (US); Jwei Wien Liu, Plano, TX (US); Jack C. Smith, Parker, TX (US); Edward Carl Fisher, Lucas, TX (US); Joyce Wong Holton, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 451 days.

(21) Appl. No.: 10/007,964

(22) Filed: Nov. 13, 2001

(65) Prior Publication Data

US 2002/0063322 A1 May 30, 2002

Related U.S. Application Data

(60) Provisional application No. 60/250,913, filed on Nov. 30, 2000.

(51) Int. Cl.
H01L 23/20 (2006.01)
H01L 23/02 (2006.01)
H01L 29/82 (2006.01)
H03J 3/20 (2006.01)

(52) U.S. Cl. ............ 257/682; 257/414; 257/415; 257/416; 257/419; 257/732; 257/774; 257/680; 331/167; 359/290; 359/291; 359/224; 359/298; 156/345.43; 438/50; 438/22; 438/52; 361/762; 361/761; 174/256; 174/52.4

(58) Field of Classification Search ............ 257/682, 257/419, 414–416, 732, 774, 680; 331/167; 359/290, 291, 224, 298; 156/345.43; 438/50, 438/22, 52; 361/762, 761; 174/256, 52.4
See application file for complete search history.

(56) References Cited

U.S. PATENT DOCUMENTS

| 3,178,506 | A | * | 4/1965 | Dereich et al. ............ 174/52.2 |
| 5,061,049 | A | | 10/1991 | Hornbeck |
| 5,583,688 | A | | 12/1996 | Hornbeck |
| 6,489,178 | B2 | * | 12/2002 | Coyle et al. ................ 438/51 |
| 6,740,946 | B2 | * | 5/2004 | Funaki ...................... 257/415 |
| 6,800,210 | B2 | * | 10/2004 | Patel et al. .................... 216/2 |
| 6,872,902 | B2 | * | 3/2005 | Cohn et al. ................ 200/181 |

* cited by examiner

*Primary Examiner*—Alexander Oscar Williams
(74) *Attorney, Agent, or Firm*—Charles A. Brill; Wade James Brady, III; Frederick J. Telecky, Jr.

(57) ABSTRACT

An anchor to hold getter materials in place within a micromechanical device package substrate. First and second cavity faces define an anchor cavity and mechanically retain a getter away from a region holding the micromechanical device. The getter anchor may be formed in a substrate comprised of at least three layers. The layers form a cavity in the substrate with a wide bottom portion—formed in the middle layer and a relatively narrower top portion—formed by the top layer. The narrow portion helps to retain the getter in the cavity by creating a mechanical lock on the wide portion of getter in the bottom of the cavity.

36 Claims, 6 Drawing Sheets

ANCHOR FOR DEVICE PACKAGE

CROSS-REFERENCE TO RELATED APPLICATIONS

This application claims priority under 35 USC §119(e)(1) of provisional application Ser. No. 60/250,913 filed Nov. 30, 2000.

The following patents and/or commonly assigned patent applications are hereby incorporated herein by reference:

| Patent No. | Filing Date | Issue Date | Title |
| --- | --- | --- | --- |
| 5,061,049 | Sep. 13, 1990 | Oct. 29, 1991 | Spatial Light Modulator and Method |
| 5,583,688 | Dec. 21, 1993 | Dec. 10, 1996 | Multi-Level Digital Micromirror Device |

FIELD OF THE INVENTION

This invention relates to the field of micro-electromechanical systems (MEMS), more particularly to methods of attaching getters in packages containing lubrication for the MEMS device.

BACKGROUND OF THE INVENTION

Micromechanical devices are small structures typically fabricated on a semiconductor wafer using techniques such as optical lithography, doping, metal sputtering, oxide deposition, and plasma etching which have been developed for the fabrication of integrated circuits.

Micromirror devices, such as the digital micromirror device (DMD) produced by Texas Instruments, are a type of micromirror device. Other types of micromechanical devices include accelerometers, pressure and flow sensors, gears and motors. While some micromechanical devices, such as pressure sensors, flow sensors, and micromirrors have found commercial success, other types have not yet been commercially viable.

MEMS devices typically have moving mechanical components that rub against each other. Lubricants are required to prevent the small components from wearing out prematurely and to reduce stiction where the components touch. One effective lubricant is perfluordecanoic acid, or PFDA. PFDA forms a monolayer over the components leaving a surface that is non-reactive. PFDA is often applied over the entire interior surface of a package, including the MEMS device. Unfortunately, once PFDA is applied to the package interior, it is very difficult to attach other components, such as moisture and gas getters, to the package. What is needed is a system and method for providing positive retention of getters to the package interior that does not rely on adhesion between the getter and the package.

SUMMARY OF THE INVENTION

Objects and advantages will be obvious, and will in part appear hereinafter and will be accomplished by the present invention which provides a method and system for a micromechanical getter anchor. One embodiment of the claimed invention provides an anchor to hold getter materials in place within a micromechanical device package substrate, said anchor comprising: a first cavity face; and a second cavity face. The first and second cavity faces define an anchor cavity and are arranged to mechanically retain a getter away from a region holding the micromechanical device.

Another embodiment of the disclosed invention provides an anchor to hold a getter in place within a micromechanical device package. The anchor comprises: a package substrate; and a member attached to the package substrate, the member shaped to provide mechanical retention of the getter material formed over said member.

Another embodiment of the disclosed invention provides a micromechanical device package comprising: a package substrate; a package lid enclosing a package cavity; a micromechanical device in the package cavity; and a getter anchor in the package cavity.

Another embodiment of the disclosed invention provides a method of packaging a micromechanical device. The method comprises: providing a package substrate having a getter anchor; attaching a micromechanical device to the package substrate; attaching a getter material to the getter anchor; and attaching a package lid to the package substrate.

Another embodiment of the disclosed invention provides a method of forming a package having an anchor. The method comprises: forming a first package substrate layer; forming a second package substrate layer, the second layer having a void; forming a third package substrate layer; laminating the first, second, and third layers such that the void forms an anchor cavity suitable for holding a getter. A further embodiment further comprises: forming a fourth package substrate layer having a void. The second and fourth layers are adjacent when laminated such that a cavity anchor with a narrow top and a relatively wide bottom is formed by the voids in the second and fourth layers.

Another embodiment of the disclosed invention provides a method of packaging a micromechanical device. The method comprises: providing a package substrate; attaching a micromechanical device to the package substrate; attaching bond wires between the micromechanical device and the package substrate; attaching a getter material to the bond wires; and attaching a package lid to the package substrate.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

A new package feature has been developed that forms an anchor to secure getters and other materials within a package. The anchor overcomes the limitations of the prior art which required the getter or other material to be adhered to the inside of the package prior to the application of a lubricant. When an anchor according to an embodiment of the present invention is used, the lubricant may be applied prior to, or simultaneously with, the getter.

Figure 1:
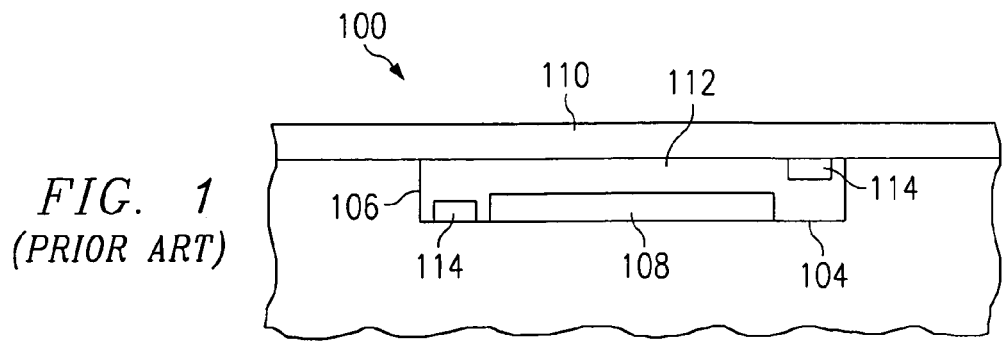
FIG. 1 is a cross section side view of a micromechanical package of the prior art showing the location of a getter within the package.

FIG. 1 is a cross section side view of a semiconductor or micromechanical package 100 of the prior art showing the location of a getter within the package. In FIG. 1, a package substrate 102 has an interior floor 104 and interior walls 106. The package substrate 102 typically is formed of layers of ceramic. The layers of ceramic include metalization regions (not shown) that provide electrical connection between the device 108 contained in the package and circuitry external to the package. After patterning the metalization on the layers, the layers are assembled and the ceramic package substrate is fired.

After mounting the micromechanical device in the package, a window 110 or lid is placed over the package cavity 112 and sealed to the ceramic base. This hermetic seal provides a controlled environment within the package cavity. Semiconductor and MEMS devices typically require protection from moisture and various gasses or other chemicals that remain on the device or in the package after the assembly process, or are released by the package and its contents. Additionally, moisture that penetrates the packages must be prevented from harming the device.

In the case of a MEMS device, moisture is particularly harmful because a polarized molecule such as water adheres to the metal surfaces of the MEMS device. If it becomes sufficiently plentiful to form a meniscus, then it can capture the moving part of the MEMS by capillary force, causing it to cease moving and rendering the part nonfunctional.

To prevent moisture and other contaminants from harming the packaged device, one or more getters are used to trap the moisture and other contaminants. These getters include any environmental control materials such as desiccants and molecular sieves. FIG. 1 shows two getters 114 attached to the inside of the package 100. The getters 114 of FIG. 1 adhere to the floor 104 of the package and the glass window 110.

As mentioned above, the use of a lubricant in the package 100 affects the adhesion of the getters. For example, if the lubricant is already in place—coating the floor 104, sides 106, and window 110—the getter 114 will be unable to adhere to the package. Alternatively, if the getter 114 is adhered to the interior of the package 100 prior to the use of the lubricant, it is possible for the lubricant to work its way between the getter 114 and package over a period of time, especially if the package is operated over a series of extreme temperature cycles, and reduce the adhesion of the getter 114. Additionally, the lubricant may react with the substance adhering the getter 114 to the package and allow the getter to loosen.

In some circumstances it is desirable to deposit the getter and lubricant materials simultaneously. For example, mixing the lubricant and getters allows them to be deposited in one operation. After depositing the materials, and typically after installing the window or lid, the lubricant is distributed throughout the package interior, often by heating the package to distribute a lubricant vapor. In this case, the lubricant and getter materials are mixed together, often with a binder or other carrier and a solvent, and deposited in the package base. Once the package is sealed, it is heated to distribute the lubricant throughout the package interior leaving the getter materials in the place they were deposited. This mixed deposition is thwarted by the lubricant since the getter materials fail to adhere to the package base when deposited while mixed with the lubricant.

Figure 2:
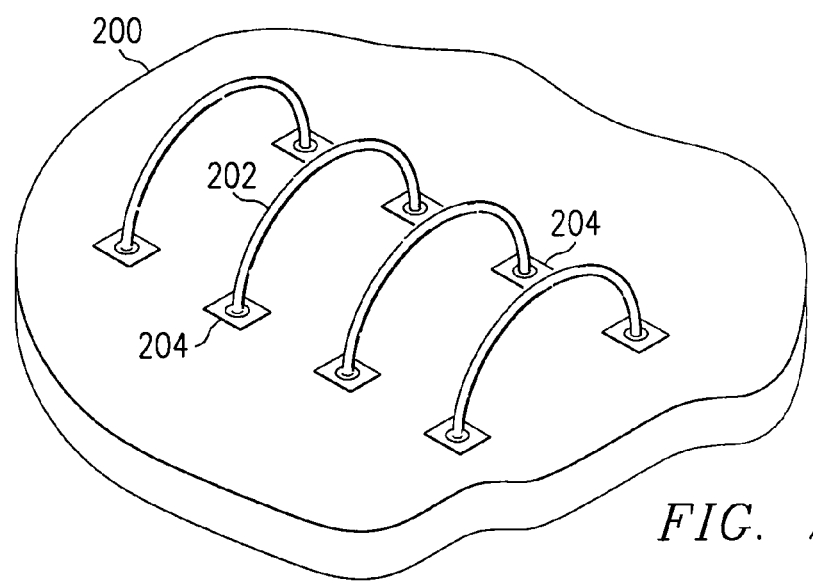
FIG. 2 is a perspective view of a portion of a micromirror package substrate showing an anchor mechanism according to one embodiment of the present invention.

A solution to the problem of keeping the getter materials in place is the use of an anchor in the package. An anchor is a feature used to mechanically lock the getter materials in the package and prevent them from moving. FIG. 2 shows on embodiment of a solution to this problem. FIG. 2 is a perspective view of a portion of a micromirror package substrate 200 showing an anchor mechanism according to one embodiment of the present invention. The anchor mechanism of FIG. 2 comprises members 202 anchored to the substrate to provide a structure on which the getter can hold without the use of adhesion. Wire members, in particular bond wires 202—that is, anchors formed from the same material as the electrically functional bond wires, are particularly well suited for use in forming the anchor since the typical process flow includes use of such wires to connect the semiconductor die or MEMS device with the package substrate.

In FIG. 2, special bond pads 204 are formed on the substrate 200 to receive the bond wires 202. The bond pads 204 may not be necessary if the bond wires 202 will adhere to the substrate 200, but typically are required to provide sufficient attachment between the gold bond wire 202 and a ceramic substrate 200. Furthermore, the bond pads may have more than one bond wire attached, and one bond pad may be used by all of the wires. The bond pads 204 typically are a plated metal bond pad 204 formed from the same materials, and during the same process steps, forming other electrical bond pads on the surface of the substrate used to electrically connect the packaged micromechanical device with external circuitry via the interconnecting metalization formed in the ceramic package base.

The size, shape, and number of the bond wire 202 loops forming the anchor are determined by several factors including the material anchored, the mass of the material anchored, and the vibrational environment to which the device will be exposed. In some environments, the bond wire loops may be attached merely by one end. For example, coiled or kinked wires would be able to hold the getter without being connected to the substrate on both ends.

Figure 3:
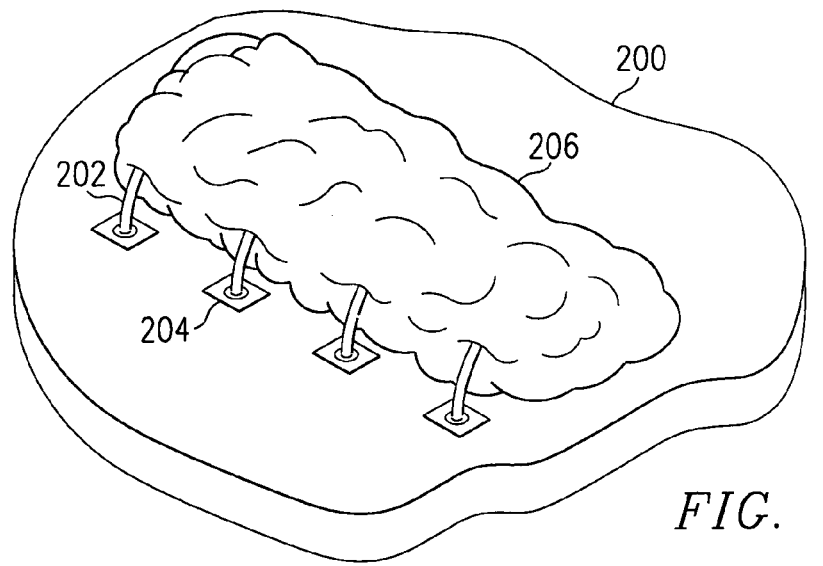
FIG. 3 is a perspective view of the portion of a micromirror package substrate of FIG. 2 showing a getter applied to, and held by, the anchor of FIG. 2.

FIG. 3 is a perspective view of the portion of a micromirror package substrate of FIG. 2 showing a getter material 206 applied to, and held by, the anchor of FIG. 2. The getter 206 shown can be any desiccant, molecular sieve, or other absorbing or gettering material that can be deposited on, and attached to, the anchor. Often the getter materials are mixed with a carrier material and a solvent to aid the delivery of the getter material. Once the getter material is delivered, typically by a pneumatic syringe, it is allowed to cure and any solvents mixed with the getter are evaporated.

Figure 4:
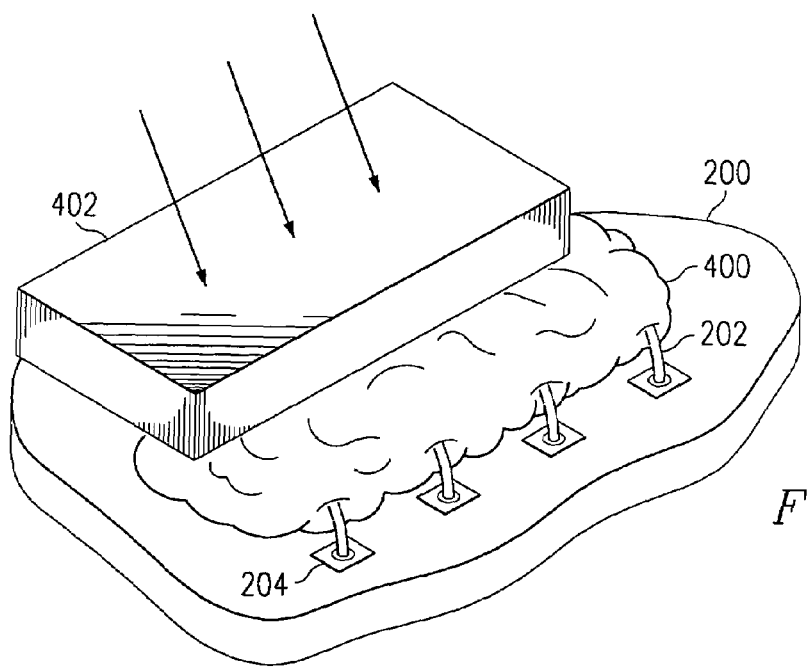
FIG. 4 is a perspective view of a portion of a micromirror package substrate showing and adhesive applied to, and held by, a getter anchor, and a pre-formed getter being applied to the adhesive.

Preformed getters can be denser than directly dispensed getters that are cured in situ. The higher density of pre-cured getters may benefit the MEMS device by providing a higher capacity for gettering. The disclosed invention is applied to the attachment of preformed getters as shown in FIG. 4. In FIG. 4, bond wires 202 attached to a substrate 200 form a getter anchor. An adhesive 400 is applied to the bond wires 202. A preformed getter 402 is then applied to the adhesive. This embodiment is important in situations where the adhesive 400 sticks to the getter 402, usually by soaking into it, but does not stick well to the substrate 200. The use of a preformed getter 402 and an adhesive 400 is also applicable to all of the embodiment described below. In the embodiments describing cavity anchors, the adhesive is placed in the cavity and the getter is attached to the adhesive.

Figure 5:
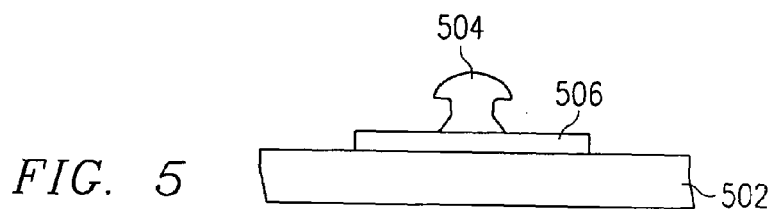
FIG. 5 is a side view of a portion of a package substrate showing an alternate anchor member configuration.
Figure 6:
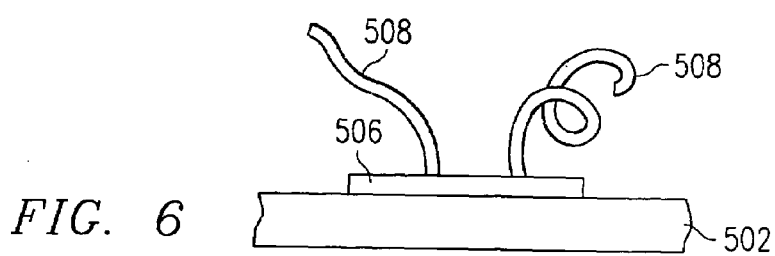
FIG. 6 is a side view of a portion of a package substrate showing an alternate anchor member configuration.

FIGS. 5 and 6 are side views of a portion of a package substrate 502 showing alternate anchor member configurations. In FIG. 5, a mushroom shaped member 504 is formed on the package substrate 502 or a bond pad 506 to capture and retain getter material applied to the member 504. In FIG. 6, one or more elongated members 508 are provided to capture and retain the getter material. The elongated members 508 typically are bond wires and generally are attached to the package substrate through an intermediate bond pad 506.

Figure 7:
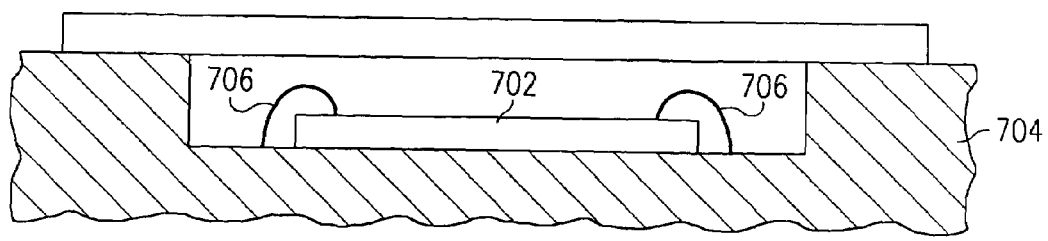
FIG. 7 is a cross section side view of a micromechanical device package showing the bond wires used in the prior art.

FIG. 7 is a cross section side view of a micromechanical device package showing the bond wires used in the prior art. In FIG. 7, a micromechanical device 702 is attached to a package substrate 704. Bond wires 706 connect the device 702 to electrical conduits formed in the substrate 704 to enable electrical communication with circuitry outside the package. These bond wires are similar to the anchor formed of bond wires shown in FIG. 2. One aspect of the present invention provides a method of utilizing the existing bond wires as an anchor for the getter material.

Figure 8:
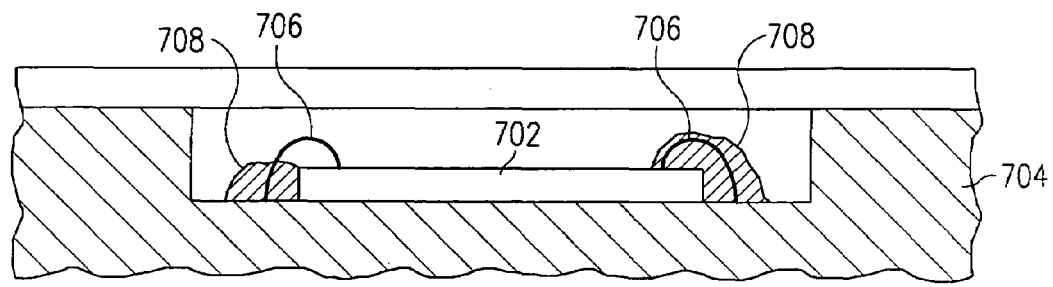
FIG. 8 is a cross section side view of a micromechanical device package showing the result of a novel application of the getter to the bond wires of FIG. 7.

FIG. 8 is a cross section side view of a micromechanical device package showing the result of the novel application of the getter to the bond wires 706 of FIG. 7. When the micromechanical device 702 is packaged, it is first attached to the package substrate 704. Bond wires 706 are then connected between bond pads on the device 702 and bond pads on the package substrate 704. The getter 708, mixed with any desired carriers and solvents, is then deposited over the bond wires 706 as shown in FIG. 8. The getter mixture is then cured, if necessary, to harden any carriers or evaporate any solvents.

Using the existing bond wires as an anchor prevents having to form a special purpose anchor for the getter and may increase the resistance of the device to vibration. The use of existing bond wires, however, also has several disadvantages and limitations. The getter and carrier used in the embodiment of FIG. 8 must be non-conductive. Additionally, applying the getter onto the bond wires risks short circuiting the bond wires, or breaking the bond wires.

Figure 9:
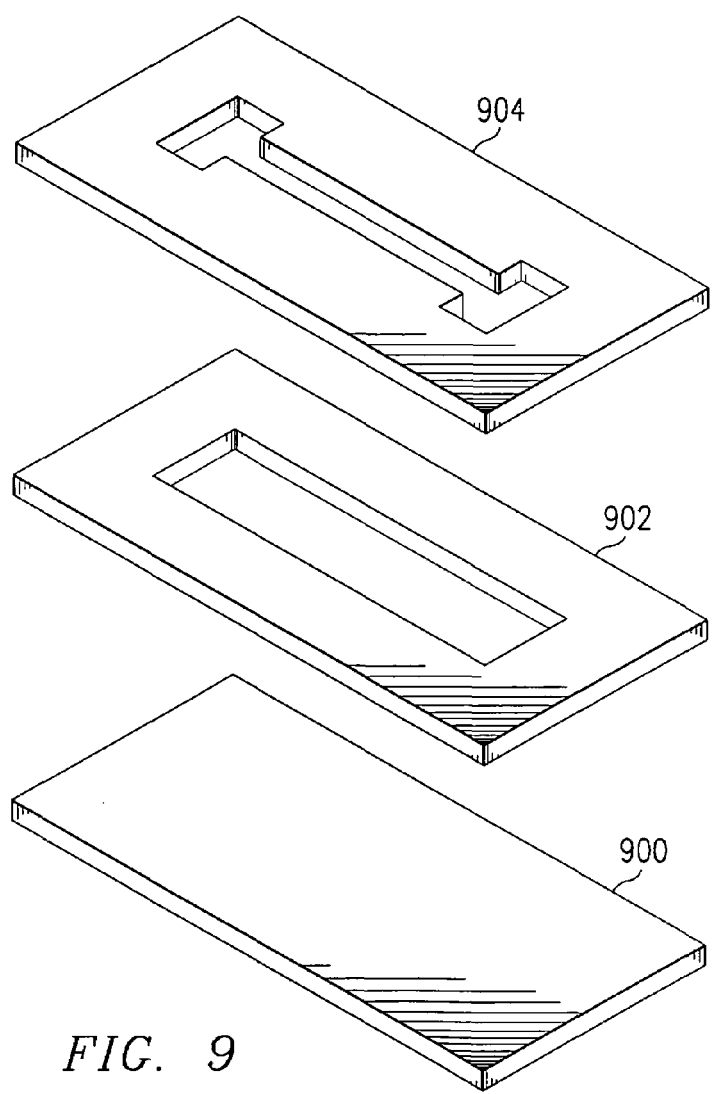
FIG. 9 is an exploded perspective view of a portion of a micromirror package substrate showing an anchor mechanism according to one embodiment of the present invention.

FIG. 9 is an exploded perspective view of a portion of a micromirror package substrate showing an anchor mechanism according to one embodiment of the present invention. In FIG. 9, three layers of ceramic material are shown. The three layers make up a portion of a ceramic package substrate similar to those talked about throughout this patent application. In FIG. 9, the bottom layer 900 is a solid piece of ceramic. The middle layer 902 has a wide strip removed from the middle of the piece. The top layer 904 has a narrow strip removed from the middle of the piece. The narrow strip removed from the middle of the top piece may be widened as shown in FIG. 9 at one or places.

Figure 10:
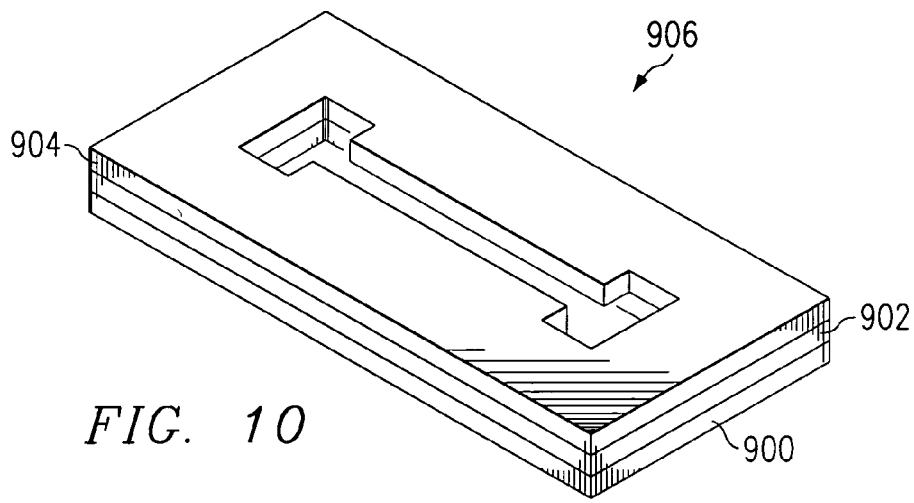
FIG. 10 is a perspective view of the portion of a micromirror package substrate of FIG. 9 showing the anchor of FIG. 9.

FIG. 10 is a perspective view of the portion of a micromirror package substrate of FIG. 9 showing the anchor of FIG. 9. FIG. 10 shows the assembled ceramic substrate 906 comprised of the layers of FIG. 9. The layers of FIG. 9 form a cavity in the ceramic substrate 906 with a wide bottom portion—formed in the middle layer 902 and a relatively narrower top portion—formed by the top layer 904. The narrow portion helps to retain the getter in the cavity by creating a mechanical lock on the wide portion of getter in the bottom of the cavity.

The examples shown in these figures merely are illustrative of simplified applications of the present invention. The number, materials, shapes and dimensions of the layers are provided for purposes of illustration and not for purposes of limitation. For example, the wide portions of the narrow slot are not necessary but are illustrated to show one structure that reduces the likelihood of pockets of air being captured in the getter anchor. Under certain conditions, air trapped beneath the getter may expand and could potentially force the getter out of the getter anchor.

Figure 11:
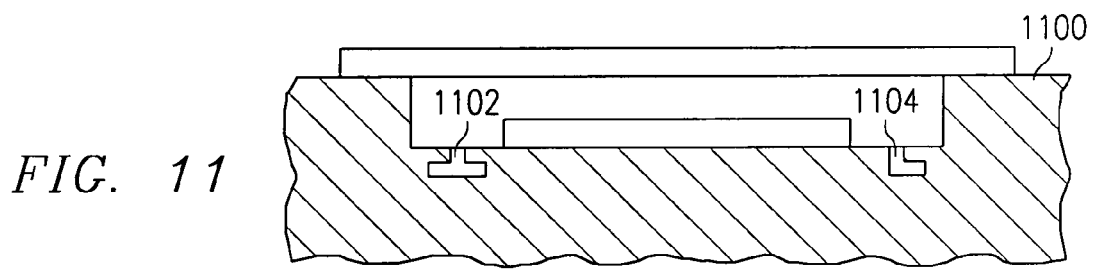
FIG. 11 is a cross section side view of a portion of a micromechanical package substrate showing a cavity formed in the substrate to anchor the getter to the substrate.

FIG. 11 is a cross section side view of a portion of a micromechanical package substrate 1100 showing two different anchor cavities 1102, 1104 formed in a substrate to anchor a getter to the substrate. The first anchor cavity is similar to the cavity of FIG. 10 in that the lower wide portion is centered under the narrow portion. The second anchor cavity 1104 has the lower wide portion offset to one side of the narrow portion. Other embodiments include wide portions that only run a portion of the length of the anchor, and wide portions with sections that are alternately offset to each side of the narrow portion. Many alternate anchor cavity configurations are possible, the only criteria being that the anchor should be able to receive and hold the getter material.

Figure 12:
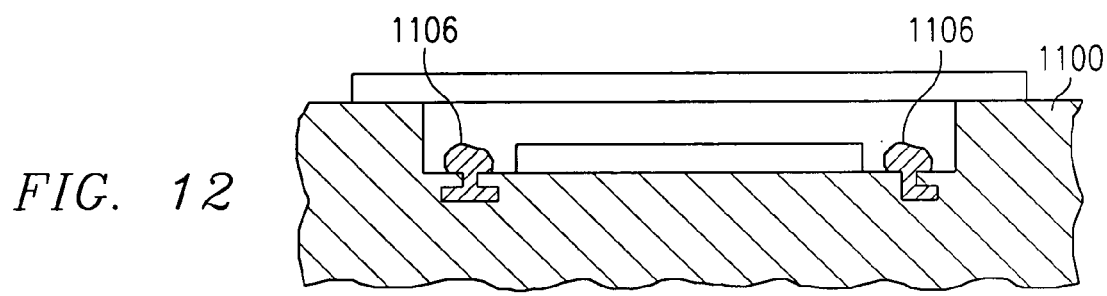
FIG. 12 is a cross section side view of the portion of a micromechanical package substrate of FIG. 11 showing a getter held by the anchor of FIG. 11.

FIG. 12 is a cross section side view of the portion of a micromechanical package substrate 1100 of FIG. 11 showing a getter 1106 held by the anchors of FIG. 11. Each of the getters 1106 in FIG. 12 extend above the package substrate 1100. This extension allows a larger quantity of the getter material to be exposed to the package cavity, but is not a necessary feature of the present invention.

Figure 13:
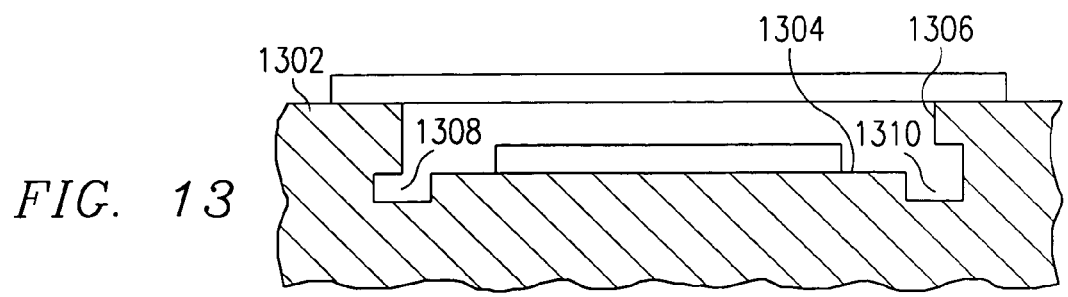
FIG. 13 is a cross section side view of a portion of a micromechanical package substrate showing an alternate cavity formed in the substrate to anchor the getter to the substrate.

FIG. 13 is a cross section side view of a portion of a micromechanical package substrate showing an alternate anchor cavity formed in the substrate to anchor the getter to the substrate. In FIG. 13, the package substrate 1302 has recesses formed in both the floor 1304 and wall 1306 portions. These recesses cooperate to form an anchor cavity capable of trapping a getter as described above. The recesses of FIG. 13 may be formed in a manner similar to the recesses described above. In FIG. 13, a first anchor cavity is formed by a recess in only the floor 1304 of the package substrate 1302, while a second anchor cavity 1310 is formed by a recess in both the floor 1304 and the wall 1306 of the package substrate.

Figure 14:
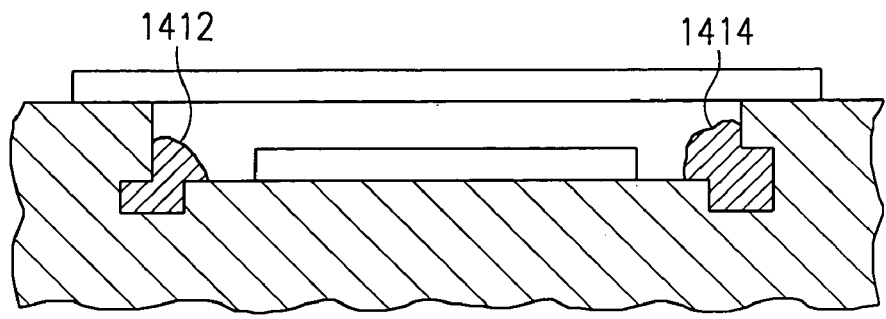
FIG. 14 is a cross section side view of the portion of a micromechanical package substrate of FIG. 13 showing a getter held by the anchor of FIG. 13.

FIG. 14 is a cross section side view of the portion of a micromechanical package substrate 1302 of FIG. 13 showing getters 1412, 1414 held by the anchor of FIG. 13. As in FIG. 11, each of the getters 1412, 1414 in FIG. 14 extend above the package substrate 1302. Not only does this extension allow a larger quantity of the getter material to be exposed to the package cavity, but the extension is likely necessary to prevent the getter material 1414 in the second anchor cavity 1310 from coming out of the anchor cavity.

Figure 15:
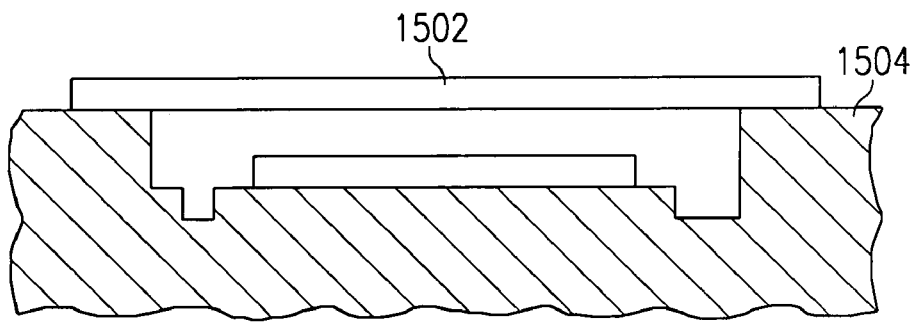
FIG. 15 is a cross section side view of a portion of a micromechanical package substrate showing an alternate cavity formed in the substrate to anchor the getter to the substrate.
Figure 16:
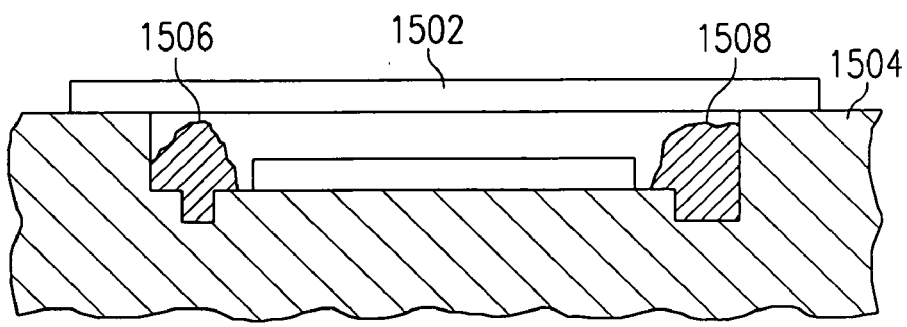
FIG. 16 is a cross section side view of the portion of a micromechanical package substrate of FIG. 15 showing a getter held by the anchor of FIG. 15.

FIG. 15 is a cross section side view of a portion of a micromechanical package substrate showing an alternate cavity formed in the substrate to anchor the getter to the substrate. The cavity anchor of FIG. 15 relies on the package lid or window 1502, in combination with the package substrate 1504, to capture and retain the getter materials. The package substrate 1504 of FIG. 15 provides a cavity to limit the motion of the getter in the plane of the package substrate and lid. The lid 1502 prevents the getter material from leaving the anchor cavity in a direction perpendicular to the plane of the package substrate. FIG. 16 is a cross section side view of the portion of a micromechanical package substrate of FIG. 15 showing getter material 1506, 1508 held by the anchor cavities of FIG. 15.

Figure 17:
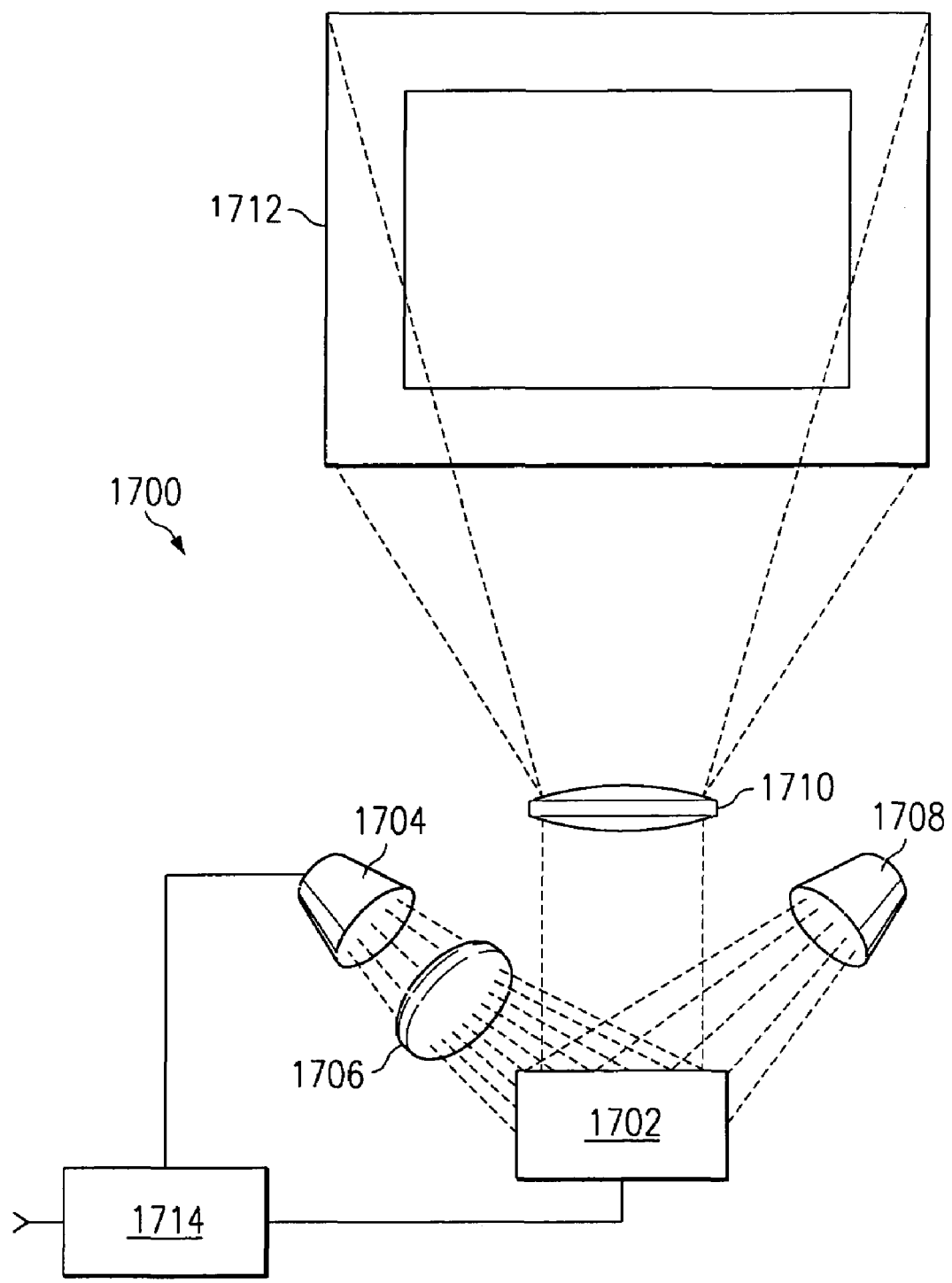
FIG. 17 is a schematic view of a micromirror-based projection system utilizing an improved micromirror device package according to one embodiment of the present invention.

FIG. 17 is a schematic view of an image projection system 1700 using a micromirror 1702 having an improved package according to the present invention. In FIG. 17, light from light source 1704 is focused on the improved micromirror 1702 by lens 1706. Although shown as a single lens, lens 1706 is typically a group of lenses and mirrors which together focus and direct light from the light source 1704 onto the surface of the micromirror device 1702. Image data and control signals from controller 1714 cause some mirrors to rotate to an on position and others to rotate to an off position. Mirrors on the micromirror device that are rotated to an off position reflect light to a light trap 1708 while mirrors rotated to an on position reflect light to projection lens 1710, which is shown as a single lens for simplicity. Projection lens 1710 focuses the light modulated by the micromirror device 1702 onto an image plane or screen 1712.

Thus, although there has been disclosed to this point a particular embodiment of a system and method for a micromechanical getter anchor, it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims.

What is claimed is:

1. An anchor to hold material in place within a micromechanical device package substrate, said anchor comprising:
a first cavity face; and
a second cavity face, said first and second cavity faces defining an anchor cavity and arranged to mechanically retain material away from a region holding said micromechanical device.

2. The anchor of claim 1, said anchor cavity having a narrow top portion and a relatively wide bottom portion.

3. The anchor of claim 2, said narrow top portion having at least one wide end.

4. The anchor of claim 1, said micromechanical package substrate having a floor portion and a wall portion, said first face recessed in said floor portion and said second face recessed in said wall portion.

5. The anchor of claim 1, said micromechanical package substrate having a floor portion and a cover portion, said first face recessed in said floor portion and said second face formed by said cover.

6. The anchor of claim 1, said anchor cavity formed by laminating at least three layers of substrate material.

7. The anchor of claim 1, said package substrate having a wall portion and a floor portion, said anchor cavity formed at a junction between said wall and floor portions.

8. The anchor of claim 1, said package substrate having a wall portion and a floor portion, said anchor cavity formed at a junction between said wall and floor portions by the formation of a recess in said floor portion, wherein said wall portion overhangs said recess.

9. The anchor of claim 1, said package substrate having a wall portion and a floor portion, said anchor cavity formed at a junction between said wall and floor portions by the formation of a recess in said wall portion, wherein said floor portion extends beyond a portion of said recess.

10. The anchor of claim 1, said package substrate having a wall portion and a floor portion, said anchor cavity formed at a junction between said wall and floor portions.

11. The anchor of claim 1, further comprising:
a third cavity face opposing said first cavity face; and
a fourth cavity face opposing said second cavity face.

12. The anchor of claim 11, said first cavity face defined by a floor of said anchor cavity.

13. The anchor of claim 11, said third cavity face defined by a transition between a narrow top portion and a relatively wider bottom portion of said anchor cavity.

14. The anchor of claim 11, said second and fourth cavity faces defined by the sides of a recess in said package substrate.

15. The anchor of claim 11, said package substrate having a wall portion and a floor portion, said anchor cavity comprising a recess in said floor portion, a floor of said recess forming said first cavity face, and a side portion of said recess forming said second cavity face.

16. The anchor of claim 11, said package substrate having a wall portion and a floor portion, said anchor cavity comprising a recess in said floor portion, a floor of said recess forming said first cavity face, and opposing side portions of said recess forming said second and fourth cavity faces.

17. The anchor of claim 11, said package substrate having a wall portion and a floor portion, said anchor cavity formed by a recess in said floor portion, said fourth cavity face comprising the underside of an overhanging portion of said wall portion.

18. The anchor of claim 11, said package substrate having a wall portion and a floor portion, said anchor cavity formed at a junction between said wall and floor portions by the formation of a recess in said wall portion, wherein said floor portion extends beyond a portion of said recess.

19. An anchor to hold material in place within a microelectronic device package, said anchor comprising:
   a substrate having an anchor cavity;
   a first cavity face; and
   a second cavity face, said first and second cavity arranged to mechanically retain material in said anchor cavity away from a region holding said microelectronic device.

20. The anchor of claim 19, said anchor cavity having a narrow opening portion and a relatively wide cavity portion.

21. The anchor of claim 20, said narrow portion having at least one wide region.

22. The anchor of claim 19, said micromechanical package substrate having a floor portion and a wall portion, said first face recessed in said floor portion and said second face recessed in said wall portion.

23. The anchor of claim 19, said micromechanical package substrate having a floor portion and a cover portion, said first face recessed in said floor portion and said second face formed by said cover.

24. The anchor of claim 19, said anchor cavity formed by laminating at least three layers of substrate material.

25. The anchor of claim 19, said package substrate having a wall portion and a floor portion, said anchor cavity formed at a junction between said wall and floor portions.

26. The anchor of claim 19, said package substrate having a wall portion and a floor portion, said anchor cavity formed at a junction between said wall and floor portions by the formation of a recess in said floor portion, wherein said wall portion overhangs said recess.

27. The anchor of claim 19, said package substrate having a wall portion and a floor portion, said anchor cavity formed at a junction between said wall and floor portions by the formation of a recess in said wall portion, wherein said floor portion extends beyond a portion of said recess.

28. The anchor of claim 19, said package substrate having a wall portion and a floor portion, said anchor cavity formed at a junction between said wall and floor portions.

29. The anchor of claim 19, further comprising:
   a third cavity face opposing said first cavity face; and
   a fourth cavity face opposing said second cavity face.

30. The anchor of claim 29, said first cavity face defined by a floor of said anchor cavity.

31. The anchor of claim 29, said third cavity face defined by a transition between a narrow top portion and a relatively wider bottom portion of said anchor cavity.

32. The anchor of claim 29, said second and fourth cavity faces defined by the sides of a recess in said package substrate.

33. The anchor of claim 29, said package substrate having a wall portion and a floor portion, said anchor cavity comprising a recess in said floor portion, a floor of said recess forming said first cavity face, and a side portion of said recess forming said second cavity face.

34. The anchor of claim 29, said package substrate having a wall portion and a floor portion, said anchor cavity comprising a recess in said floor portion, a floor of said recess forming said first cavity face, and opposing side portions of said recess forming said second and fourth cavity faces.

35. The anchor of claim 29, said package substrate having a wall portion and a floor portion, said anchor cavity formed by a recess in said floor portion, said fourth cavity face comprising the underside of an overhanging portion of said wall portion.

36. The anchor of claim 29, said package substrate having a wall portion and a floor portion, said anchor cavity formed at a junction between said wall and floor portions by the formation of a recess in said wall portion, wherein said floor portion extends beyond a portion of said recess.

* * * * *